US012575269B2

(12) United States Patent
Huangfu et al.

(10) Patent No.: US 12,575,269 B2
(45) Date of Patent: Mar. 10, 2026

(54) PIXEL WITH RING SHAPE AROUND AN ISLAND, ARRAY SUBSTRATE AND DISPLAY APPARATUS

(71) Applicant: BOE TECHNOLOGY GROUP CO., LTD., Beijing (CN)

(72) Inventors: Lujiang Huangfu, Beijing (CN); Xing Fan, Beijing (CN); Hao Gao, Beijing (CN); Hao Zhang, Beijing (CN); Qiuhua Meng, Beijing (CN); Na Li, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/320,373

(22) Filed: May 19, 2023

(65) Prior Publication Data

US 2023/0301143 A1     Sep. 21, 2023

Related U.S. Application Data

(63) Continuation of application No. 17/057,027, filed as application No. PCT/CN2020/079717 on Mar. 17, 2020, now Pat. No. 11,800,752.

(30) Foreign Application Priority Data

Mar. 25, 2019     (CN) .......................... 201910228109.3

(51) Int. Cl.
*H10K 59/122*          (2023.01)
(52) U.S. Cl.
CPC ................................... *H10K 59/122* (2023.02)

(58) Field of Classification Search
CPC .............................. H01L 33/38; H10K 59/122
See application file for complete search history.

(56) References Cited

U.S. PATENT DOCUMENTS 9,536,931 B2     1/2017   Kim et al.
9,685,634 B2     6/2017   Huangfu et al.
(Continued)

FOREIGN PATENT DOCUMENTS

CN          103000823 A          3/2013
CN          103219354 A          7/2013
(Continued)

OTHER PUBLICATIONS

Office Action dated Aug. 31, 2020, issued in counterpart CN Application No. 201910228109.3. 13 pages.
(Continued)

*Primary Examiner* — Peter Bradford
(74) *Attorney, Agent, or Firm* — WHDA, LLP

(57)          ABSTRACT

A display apparatus is provided, including a plurality of light-emitting units disposed on a substrate. Each light-emitting unit includes a first electrode layer, an organic light-emitting layer and a second electrode layer arranged in sequence along a first direction, and has a first light-emitting region, an island-shaped region and a second light-emitting region continuously arranged in sequence along a second direction. The first direction is a direction perpendicular to the substrate, and the second direction is a direction parallel to the substrate. The first electrode layer continuously extends in the first light-emitting region, the island-shaped region and the second light-emitting region, and the first electrode layer is formed with a first protrusion portion in the island-shaped region.

17 Claims, 1 Drawing Sheet

(56) References Cited

U.S. PATENT DOCUMENTS

| | | | |
|---|---|---|---|
| 9,960,206 B2 | 5/2018 | Saito et al. | |
| 9,978,819 B2 | 5/2018 | Jang et al. | |
| 10,319,796 B2 | 6/2019 | Jang et al. | |
| 10,608,063 B2 | 3/2020 | Jang et al. | |
| 11,056,544 B1 | 7/2021 | Wei et al. | |
| 2013/0187163 A1 | 7/2013 | Kim et al. | |
| 2014/0339514 A1* | 11/2014 | Oh | H10K 50/852 |
| | | | 257/40 |
| 2015/0044805 A1 | 2/2015 | Ishino et al. | |
| 2016/0043151 A1 | 2/2016 | Kato | |
| 2016/0359142 A1 | 12/2016 | Huangfu et al. | |
| 2017/0084676 A1 | 3/2017 | Jang et al. | |
| 2017/0294155 A1* | 10/2017 | Kim | G09G 3/2074 |
| 2018/0026086 A1 | 1/2018 | Adachi et al. | |
| 2018/0211979 A1* | 7/2018 | Lee | H01L 33/60 |
| 2018/0247987 A1 | 8/2018 | Jang et al. | |
| 2019/0067439 A1 | 2/2019 | Clifton et al. | |
| 2020/0194523 A1 | 6/2020 | Jang et al. | |
| 2022/0069036 A1 | 3/2022 | Huang | |
| 2022/0069040 A1 | 3/2022 | Lee et al. | |
| 2022/0223663 A1 | 7/2022 | Wen et al. | |

FOREIGN PATENT DOCUMENTS

| | | | | | |
|---|---|---|---|---|---|
| CN | 104733501 A | | 6/2015 | | |
| CN | 105870154 A | | 8/2016 | | |
| CN | 106449657 A | | 2/2017 | | |
| CN | 106784362 A | | 5/2017 | | |
| CN | 106935621 A | | 7/2017 | | |
| CN | 108321178 A | | 7/2018 | | |
| CN | 108962939 A | | 12/2018 | | |
| CN | 109950282 A | | 6/2019 | | |
| CN | 110459582 A | | 11/2019 | | |
| CN | 111628114 A | | 9/2020 | | |
| CN | 109583420 B | * | 2/2021 | | G06K 9/0004 |
| JP | 2012113934 A | * | 6/2012 | | |
| WO | 2021217746 A1 | | 11/2021 | | |

OTHER PUBLICATIONS

Non-Final Office Action dated Mar. 31, 2022, issued in U.S. Appl. No. 17/057,027. 7 pages.

Final Office Action dated Sep. 27, 2022, issued in U.S. Appl. No. 17/057,027. 17 pages.

Non-Final Office Action dated Jan. 6, 2023, issued in U.S. Appl. No. 17/057,027. 16 pages.

Notice of Allowance dated Aug. 4, 2023, issued in U.S. Appl. No. 17/057,027 (9 pages).

* cited by examiner

PIXEL WITH RING SHAPE AROUND AN ISLAND, ARRAY SUBSTRATE AND DISPLAY APPARATUS

CROSS-REFERENCE TO RELATED APPLICATION

This application is a continuation application of U.S. patent application Ser. No. 17/057,027, filed Nov. 19, 2020, which in turn is a Section 371 National Stage Application of International Application No. PCT/CN2020/079717, filed on Mar. 17, 2020, which claims priority to Chinese Patent Application No. 201910228109.3 filed on Mar. 25, 2019, the disclosures of which are incorporated herein by reference in their entirety.

TECHNICAL FIELD

Embodiments of the present disclosure relate to the field of display technology, and in particular, to a pixel structure, an array substrate and a display apparatus.

BACKGROUND

A reflective structure in an array substrate is used to prevent light of light emitting devices from being lost due to propagation in a direction of arrangement of the light emitting devices.

SUMMARY

Embodiments of the present disclosure provide a pixel structure, including: a pixel definition layer having a first side and a second side which are opposite to each other in a thickness direction of the pixel definition layer, the pixel definition layer including a pixel opening having sidewalls; an island-shaped portion disposed in the pixel opening of the pixel definition layer and spaced apart from the sidewalls of the pixel opening, the island-shaped portion having sidewalls, and the sidewalls of the pixel opening and the sidewalls of the island-shaped portion defining a ring-shaped pixel groove; and a light emitting unit, at least a part of which is disposed in the ring-shaped pixel groove.

In accordance with embodiments of the present disclosure, a section of the island-shaped portion parallel to the pixel definition layer gradually decreases in a direction from the first side to the second side of the pixel definition layer.

In accordance with embodiments of the present disclosure, the sidewalls of the pixel opening are respectively parallel to the sidewalls of the island-shaped portion in a section parallel to the pixel definition layer.

In accordance with embodiments of the present disclosure, in a section parallel to the pixel definition layer, the pixel opening has a polygonal shape, the island-shaped portion has a polygonal shape, and the sidewalls of the pixel opening are respectively parallel to the sidewalls of the island-shaped portion.

In accordance with embodiments of the present disclosure, in a section parallel to the pixel definition layer, the pixel opening has a rectangular shape, the island-shaped portion has a rectangular shape, and the sidewalls of the pixel opening are respectively parallel to the sidewalls of the island-shaped portion.

In accordance with embodiments of the present disclosure, in a section parallel to the pixel definition layer, intervals between the sidewalls of the pixel opening and the corresponding sidewalls of the island-shaped portion are equal.

In accordance with embodiments of the present disclosure, in a section perpendicular to the pixel definition layer, the island-shaped portion has a trapezoidal shape.

In accordance with embodiments of the present disclosure, in a direction perpendicular to the pixel definition layer, a height of the sidewall of the pixel opening is equal to a height of the sidewall of the island-shaped portion.

In accordance with embodiments of the present disclosure, the pixel definition layer and the island-shaped portion are disposed in a same layer and a material of the pixel definition layer is the same as a material of the island-shaped portion.

In accordance with embodiments of the present disclosure, the light emitting unit includes a first electrode layer, a second electrode layer, and a light emitting layer disposed between the first electrode layer and the second electrode layer.

In accordance with embodiments of the present disclosure, a width of the ring-shaped pixel groove gradually increases in a direction from the first side to the second side of the pixel definition layer.

In accordance with embodiments of the present disclosure, a section of the ring-shaped pixel groove has a shape of an inverted trapezoid in a direction perpendicular to the pixel definition layer.

In accordance with embodiments of the present disclosure, the pixel structure further includes: a first insulating layer on which the pixel definition layer and the island-shaped portion are disposed.

In accordance with embodiments of the present disclosure, a part of the first insulating layer is exposed between the sidewalls of the pixel opening and the sidewalls of the island-shaped portion, and constitutes a bottom of the ring-shaped pixel groove.

In accordance with embodiments of the present disclosure, the light emitting unit includes a first electrode layer, and the first electrode layer includes: a ring-shaped first portion covering the part of the first insulating layer exposed between the sidewalls of the pixel opening and the sidewalls of the island-shaped portion; and a second portion covering the sidewalls of the pixel opening and the island-shaped portion.

In accordance with embodiments of the present disclosure, the pixel structure further includes: a second insulating layer disposed on the first electrode layer and exposing at least a part of the first portion of the first electrode layer.

In accordance with embodiments of the present disclosure, the first portion of the first electrode layer or the exposed part of the first portion of the first electrode layer has a ring shape, and has a width less than or equal to 6 μm in a direction from the sidewall of the pixel opening to the sidewall of the island-shaped portion.

In accordance with embodiments of the present disclosure, the light emitting unit has a ring shape.

Embodiments of the present disclosure further provide an array substrate including the above pixel structure.

Embodiments of the present disclosure further provide a display apparatus including the above array substrate.

BRIEF DESCRIPTION OF THE DRAWINGS

Various objects, features, and advantages of the present disclosure will become more apparent through detailed description of exemplary embodiments of the present disclosure taken in conjunction with the drawings. The drawings are merely exemplary illustrations of the present disclosure and are not necessarily drawn to scale. The same reference signs always indicate the same or similar components in the drawings, in which.

DETAILED DESCRIPTION OF EMBODIMENTS

Figure 1:
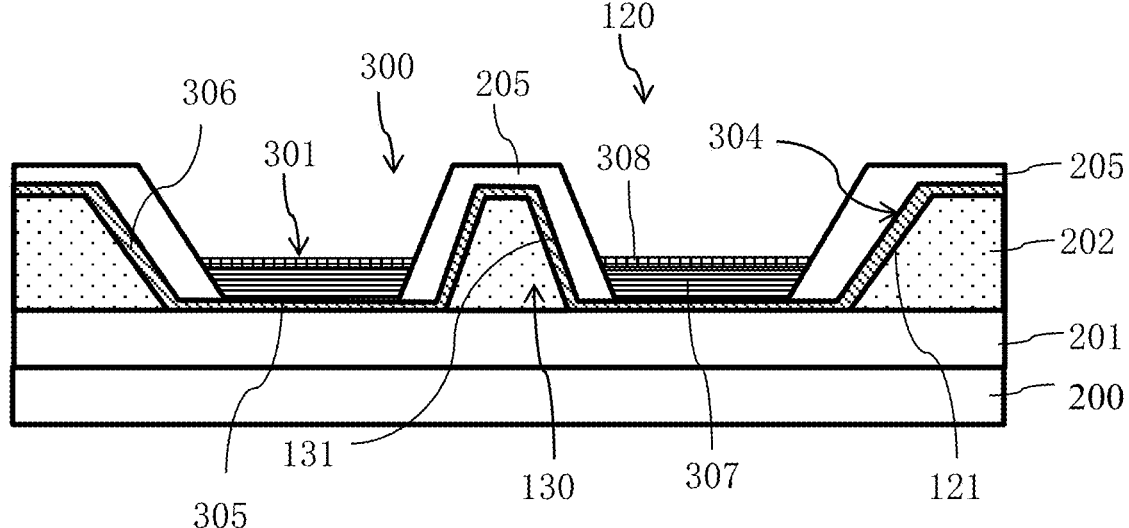
FIG. 1 is a schematic view of a stacked structure of a pixel structure according to an exemplary embodiment of the present disclosure.
Figure 2:
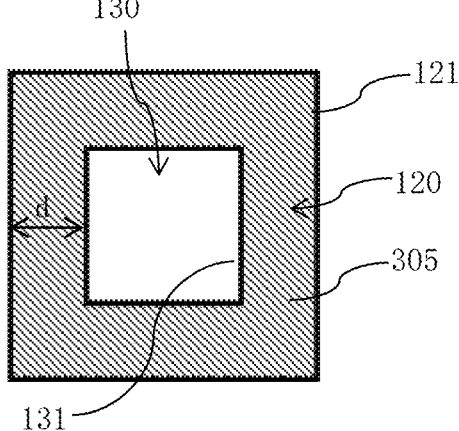
FIG. 2 is a schematic top view of the pixel structure shown in FIG. 1.

Referring to FIG. 1 and FIG. 2, embodiments of the present disclosure provide a pixel structure. The pixel structure includes a pixel definition layer 202; the pixel definition layer 202 having a first side and a second side (the lower side and the upper side of the pixel definition layer 202 in FIG. 1) which are opposite to each other in a thickness direction of the pixel definition layer 202, the pixel definition layer 202 including a pixel opening 120 having sidewalls 121; an island-shaped portion 130 disposed in the pixel opening 120 of the pixel definition layer 202 and spaced apart from the sidewalls 121 of the pixel opening 120, the island-shaped portion 130 having sidewalls 131, and the sidewalls 121 of the pixel opening 120 and the sidewalls 131 of the island-shaped portion 130 defining a ring-shaped pixel groove 300; and a light emitting unit 301, at least a part of which is disposed in the ring-shaped pixel groove 300. According to an embodiment of the present disclosure, the width of the ring-shaped pixel groove 300 may gradually increase in a direction from the first side to the second side of the pixel definition layer 202. For example, the section of the ring-shaped pixel groove 300 may have a shape of an inverted trapezoid in a direction perpendicular to the pixel definition layer 202. According to an embodiment of the present disclosure, the light emitting unit 301 has a ring shape.

Referring to FIG. 1 and FIG. 2, in some embodiments of the present disclosure, a section (the horizontal section in FIG. 1) of the island-shaped portion 130 parallel to the pixel definition layer 202 gradually decreases in the direction from the first side to the second side of the pixel definition layer 202. According to some embodiments of the present invention, the island-shaped portion 130 has a trapezoidal shape in a section (the vertical section in FIG. 1) perpendicular to the pixel definition layer 202.

Referring to FIG. 1 and FIG. 2, in some embodiments of the present disclosure, in the section parallel to the pixel definition layer 202, the sidewalls 121 of the pixel opening 120 are parallel to the sidewalls 131 of the island-shaped portion 130. For example, in the section parallel to the pixel definition layer 202, the pixel opening 120 has a polygonal shape, the island-shaped portion 130 has a polygonal shape, and the sidewalls 121 of the pixel opening 120 are respectively parallel to the sidewalls 131 of the island-shaped portion 130. In the embodiment shown in FIG. 1, in the section parallel to the pixel definition layer 202, the pixel opening 120 has a rectangular shape, the island-shaped portion 130 has a rectangular shape, and the sidewalls 121 of the pixel opening 120 are respectively parallel to the sidewalls 131 of the island-shaped portion 130.

Referring to FIG. 1 and FIG. 2, in some embodiments of the present disclosure, in the section parallel to the pixel definition layer 202, the intervals between the sidewalls 121 of the pixel opening 120 and the corresponding sidewalls 131 of the island-shaped portion 130 are all equal.

Referring to FIG. 1 and FIG. 2, in some embodiments of the present disclosure, the height of the sidewall 121 of the pixel opening 120 is equal to the height of the sidewall 131 of the island-shaped portion 130 in a direction (the vertical direction in FIG. 1) perpendicular to the pixel definition layer 202.

Referring to FIG. 1 and FIG. 2, in some embodiments of the present disclosure, the pixel definition layer 202 and the island-shaped portion 130 are disposed in the same layer, and the material of the pixel definition layer 202 and the material of the island-shaped portion 130 are the same. For example, they are formed of the same photoresist layer by using the same patterning process. In this case, the pixel definition layer 202 includes the island-shaped portion 130.

Referring to FIG. 1 and FIG. 2, in some embodiments of the present disclosure, the light emitting unit 301 includes a first electrode layer 304, a second electrode layer 308, and a light emitting layer 307 disposed between the first electrode layer 304 and the second electrode layer 308. The light emitting layer 307 may be an organic light-emitting layer.

Referring to FIG. 1 and FIG. 2, in some embodiments of the present disclosure, the pixel structure further includes: a first insulating layer 201. The pixel definition layer 202 and the island-shaped portion 130 are disposed on the first insulating layer 201. A part of the first insulating layer 201 is exposed between the sidewalls 121 of the pixel opening 120 and the sidewalls 131 of the island-shaped portion 130 and constitutes a bottom of the ring-shaped pixel groove 300. The light emitting unit 301 includes a first electrode layer 304, and the first electrode layer 304 includes: a ring-shaped first portion 305 covering the part of the first insulating layer 201 exposed between the sidewalls 121 of the pixel opening 120 and the sidewalls 131 of the island-shaped portion 130; and the second portion 306 covering the sidewalls 121 of the pixel opening 120 and the island-shaped portion 130. The pixel structure may further include: a second insulating layer 205 disposed on the first electrode layer 304 and exposing at least a part of the first portion 305 of the first electrode layer 304.

Referring to FIG. 1 and FIG. 2, in some embodiments of the present disclosure, the first portion 305 of the first electrode layer 304 or the exposed part of the first portion 305 of the first electrode layer 304 has a ring shape, and has a width d less than or equal to 6 μm in a direction from the sidewall 121 of the pixel opening 120 to the sidewall 131 of the island-shaped portion 130. The first portion of the first electrode layer 304 or the exposed part of the first portion of the first electrode layer 304 may have a uniform width.

In some embodiments of the present disclosure, for example, in the case where the pixel structure is used in an OLED display apparatus, the first electrode layer may be an anode and the second electrode layer may be a cathode, or the first electrode layer may be the cathode and the second electrode layer may be the anode. In addition, the light emitting layer may be an organic light-emitting layer, and may also include one or more of an electron injection layer, an electron transport layer, a hole transport layer, and a hole injection layer according to the requirements for improving performance.

In some embodiments of the present disclosure, for example, in the case where the pixel structure is used in an OLED display apparatus, the pixel structure further includes: a substrate 200, and a pixel driving unit disposed on the substrate 200, and the first insulating layer 201 is disposed on the pixel driving unit. The first electrode layer 304 is electrically connected to a drain of a thin film transistor in the pixel driving unit through a via formed in the first insulating layer 201, so that the thin film transistor provides the first electrode layer 304 with a driving signal. The first insulating layer 201 may include at least one of a passivation layer and a planarization layer.

FIG. 1 shows a schematic view of a stacked structure of a pixel structure according to an embodiment of the present disclosure. Referring to FIG. 1, in this exemplary embodiment, the pixel structure according to the embodiment of the present disclosure is described by taking its application to an OLED display device as an example. It is easily understood by those skilled in the art that the pixel structure of the embodiments of the present disclosure can be applied to other types of display devices or other semiconductor devices.

As shown in FIG. 1, in the present embodiment, in the pixel structure according to the embodiment of the present disclosure, the pixel opening 120 may constitute a reflective cup structure, and the island-shaped portion 130 may constitute a reflective island structure.

As shown in FIG. 1, in the present embodiment, the size of the conventional pixel structure is much larger than the energy propagation distance, and the perimeter to area ratio of the light emitting region of the pixel structure is relatively small, resulting in low extraction efficiency of the reflective cup structure. The extraction efficiency of the reflective cup structure can be understood as the increase effect of the reflective cup structure on the external quantum efficiency (EQE) of the device.

Compared with the conventional pixel structure, the pixel structure according to the present disclosure reduces the area of the light emitting region of the pixel structure due to the addition of the island-shaped portion 130 in the pixel opening 120, thereby increasing the perimeter to area ratio of the light emitting region of the pixel structure (the perimeter to area ratio can be understood as the ratio of the perimeter of the pixel opening 120 in a section parallel to the pixel definition layer 202, that is, the sum of the lengths of the sidewalls 121, to the area of the exposed part of the first electrode layer 304), thereby reducing the propagation loss of light propagating to the reflecting surface and effectively improving the light extraction efficiency. That is, by increasing the perimeter to area ratio, a perimeter to area ratio of the reflective structure can be increased, thereby increasing the light extraction effect of the reflective cup structure.

As shown in FIG. 2, in the present embodiment, in order to facilitate understanding, the pixel structure according to the present disclosure is described by taking the rectangular shape of the pixel opening 120 as an example. Specifically, the pixel opening 120 of the pixel structure has the rectangular shape and has four sidewalls 121. According to some embodiments of the present disclosure, the section of the island-shaped portion 130 parallel to the pixel definition layer 202 may has a rectangular shape, that is, the island-shaped portion 130 has four sidewalls 131. The four sidewalls 131 of the island-shaped portion 130 correspond to the four sidewalls 121 respectively. In the section of the pixel structure (that is, the section parallel to the pixel definition layer 202), the four sidewalls 131 are parallel to the four sidewalls 121, respectively.

Further, as shown in FIG. 2, in the present embodiment, the width d of the part of the first electrode layer 304 exposed in the pixel opening 120 in the direction from the sidewall 131 to the sidewall 121 may be less than or equal to 6 μm. Due to the loss of energy in the propagation process (caused by factors such as interference cancellation, material absorption), by reducing the distance of light propagating to the reflective cup structure, energy loss can be reduced, energy utilization can be effectively improved, and thus the external quantum efficiency of the device can be improved.

Furthermore, as shown in FIG. 2, in the present embodiment, the intervals between the sidewalls 131 and the corresponding sidewalls 121 may be equal.

It should be noted that, in other embodiments, the shapes of the pixel opening 120 and the island-shaped portion 130 of the pixel structure are not limited to the above-mentioned shapes in the present embodiment. It is only necessary to ensure that the outer wall of the island-shaped portion 130 is spaced apart from the sidewalls 121 of the pixel opening 120, so as to ensure that the arrangement of the island-shaped portion 130 is used in the pixel structure, and the orthographic projection of the light emitting region of the pixel structure on a plane parallel to the pixel definition layer 202 is in a shape of a closed ring.

As shown in FIG. 1, in the present embodiment, the section of the island-shaped portion 130 in a plane perpendicular to the pixel definition layer 202 may have a trapezoidal shape.

Further, as shown in FIG. 1, in the present embodiment, the section of the island-shaped portion 130 in the plane perpendicular to the pixel definition layer 202 may be an isosceles trapezoid.

As shown in FIG. 1, in the present embodiment, the height of the island-shaped portion 130 is equal to the height of the pixel definition layer 202 forming the pixel opening 120. Alternatively, the top of the part of the second insulating layer 205 on the island-shaped portion 130 is flush with the top of the part of the second insulating layer 205 on the pixel definition layer 202 forming the pixel opening 120.

As shown in FIG. 1, in the present embodiment, the pixel structure further includes a first electrode layer 304 as an anode layer and a second insulating layer 205. The first electrode layer 304 is disposed on the top of the pixel definition layer 202, the sidewalls 121 and the part of the first insulating layer 201 exposed between the sidewalls 121 of the pixel opening 120 and the sidewalls 131 of the island-shaped portion 130, and the island-shaped portion 130. Specifically, the first electrode layer 304 is disposed on the top of the pixel definition layer 202 and the sidewalls 121, and is also disposed on the part of the first insulating layer 201 exposed between the sidewalls 121 of the pixel opening 120 and the sidewalls 131 of the island-shaped portion 130, and on the island-shaped portion 130. The second insulating layer 205 is disposed on the first electrode layer 304, and the second insulating layer 205 is not disposed on the part of the first electrode layer 304 disposed on the first insulating layer 201. As shown in FIG. 1, the part of the first electrode layer 304 disposed on the first insulating layer 201 is exposed between the parts of the second insulating layer 205 on the sidewall 121 of the pixel opening 120 and on the sidewall 131 of the island-shaped portion 130 so as to form a light emitting region of the pixel structure.

It should be noted here that the pixel structures shown in the drawings and described in this description are only a few examples of many types of pixel structures in which the principles of the present disclosure are used. It should be clearly understood that the principle of the present disclosure is by no means limited to only any details or any stacked structure of the pixel structure shown in the drawings or described in this description.

The present disclosure also provides an array substrate including the pixel structure described in any one of the above embodiments.

The present disclosure also provides a display apparatus including the array substrate described in any one of the above-mentioned embodiments.

The display apparatus may be any products or components with a display function, such as an OLED panel, a mobile phone, a tablet computer, a TV set, a displayer, a notebook computer, a digital frame, and a navigator.

In this exemplary embodiment, the array substrate according to the present disclosure is described by taking the array substrate of an OLED display apparatus as an example. It is easily understood by those skilled in the art that the pixel structure of the present disclosure can be applied to other types of array substrates.

It should be noted here that the array substrates shown in the drawings and described in this description are only a few examples of many types of array substrates in which the principles of the present disclosure can be used. It should be clearly understood that the principles of the present disclosure are by no means limited to only any details or any components of the array substrate shown in the drawings or described in this description.

In this exemplary embodiment, the display apparatus according to the present disclosure is described by taking an OLED display apparatus as an example. Those skilled in the art can easily understand that the pixel structure of the present disclosure can be applied to other types of display apparatuses.

It should be noted here that the display apparatuses shown in the drawings and described in this description are only a few examples of many types of display apparatuses in which the principles of the present disclosure can be used. It should be clearly understood that the principle of the present disclosure is by no means limited to only any details or any components of the display apparatus shown in the drawings or described in this description.

In the present embodiment, the material of the first insulating layer may be an organic material, such as poly-imide, the material of the pixel definition layer may be an organic material, such as polyimide, the material of the island-shaped portion may be an organic material, such as polyimide, and the material of the second insulating layer may be an organic material, such as polyimide.

In summary, the embodiments of the present disclosure provide a pixel structure, an array substrate, and a display apparatus. The pixel structure includes an island-shaped portion. The island-shaped portion is disposed in the pixel opening. Accordingly, the area of the light emitting region of the pixel structure is reduced by adding the island-shaped portion in the pixel opening, thereby increasing the perimeter to area ratio of the light emitting region of the pixel structure, thereby reducing the propagation loss of light to the reflective surface, effectively improving the light extraction efficiency of the reflective cup structure.

The terms "first" and "second" are only used for descriptive purposes, and cannot be understood as indicating or implying relative importance or implicitly indicating the number of modified technical features. Thus, the features defined with "first" and "second" may explicitly or implicitly include one or more of these features. In the description of the present disclosure, unless otherwise specified, "plurality" means two or more.

Although the embodiments disclosed in the present disclosure are as described above, the contents described are only the embodiments used to facilitate the understanding of the present disclosure, and are not intended to limit the present disclosure. Any person skilled in the art can make any modifications and changes in implementation form and details without departing from the spirit and scope disclosed in this disclosure. However, the protection scope of the present disclosure is still defined by the appended claims.

What is claimed is:

1. A display apparatus, comprising a plurality of light-emitting units disposed on a substrate, wherein each light-emitting unit comprises a first electrode layer, an organic light-emitting layer and a second electrode layer arranged in sequence along a first direction, and has a first light-emitting region, an island-shaped region and a second light-emitting region continuously arranged in sequence along a second direction, the first direction being a direction perpendicular to the substrate and the second direction being a direction parallel to the substrate, wherein the first electrode layer continuously extends in the first light-emitting region, the island-shaped region and the second light-emitting region, and the first electrode layer is formed with a first protrusion portion in the island-shaped region;

wherein the first electrode layer is formed with a second protrusion portion at an edge of the light-emitting unit, and the first light-emitting region and the second light-emitting region are defined by the first protrusion portion and the second protrusion portion; and wherein the light-emitting unit further comprises: a second insulating layer disposed on a side of the first electrode layer away from the substrate, wherein the second insulating layer covers the first protrusion portion and the second protrusion portion.

2. The display apparatus of claim 1, wherein an orthographic projection of the island-shaped region on the substrate has a rectangular shape.

3. The display apparatus of claim 1, wherein the island-shaped region is a non-light-emitting region and is configured to reflect light emitted from the first light-emitting region and light emitted from the second light-emitting region.

4. The display apparatus of claim 1, wherein a slope of a sidewall of the first protrusion portion is greater than a slope of a sidewall of the second protrusion portion.

5. The display apparatus of claim 1, wherein a region enclosed by the first protrusion portion and a plane parallel to a surface of the first electrode layer in the first light-emitting region proximate to the substrate has a trapezoidal cross-section along the first direction.

6. The display apparatus of claim 1, wherein in the first direction, a surface of the first protrusion portion away from the substrate has a first height with respect to a surface of the substrate facing the light-emitting unit, and a surface of the second protrusion portion away from the substrate has a second height with respect to the surface of the substrate facing the light-emitting unit, wherein the first height is substantially equal to the second height.

7. The display apparatus of claim 6, wherein a surface of the second electrode layer away from the substrate has a third height with respect to the surface of the substrate facing the light-emitting unit, and the third height is smaller than each of the first height and the second height.

8. The display apparatus of claim 1, wherein, in the second direction, a size of an orthographic projection of at least one of the first light-emitting region and the second light-emitting region on the substrate is larger than a size of an orthographic projection of the island-shaped region on the substrate.

9. The display apparatus of claim 1, wherein each of the second electrode layer and the organic light-emitting layer is located in the first light-emitting region and the second light-emitting region, an orthographic projection of the second electrode layer on the substrate does not overlap with an orthographic projection of the first protrusion portion on the substrate, and an orthographic projection of the organic light-emitting layer on the substrate does not overlap with the orthographic projection of the first protrusion portion on the substrate.

10. The display apparatus of claim 1, wherein the light-emitting unit further comprises a pixel definition layer disposed on a side of the first electrode layer facing the substrate, wherein the pixel definition layer has a first surface and a second surface which are opposite to each other in the first direction, wherein the pixel definition layer comprises:

a pixel opening having sidewalls; and an island-shaped portion disposed on a side of the first protrusion portion facing the substrate, wherein the island-shaped portion is located in the pixel opening and spaced apart from the sidewalls of the pixel opening, the island-shaped portion has sidewalls, and the sidewalls of the pixel opening and the sidewalls of the island-shaped portion define a ring-shaped pixel groove, wherein the organic light-emitting layer and the second electrode layer are disposed in the ring-shaped pixel groove.

11. The display apparatus of claim 10, wherein the sidewalls of the pixel opening are covered by the second protrusion portion.

12. The display apparatus of claim 10, wherein in a direction from the first surface of the pixel defining layer to the second surface of the pixel defining layer, an area of a section of the island-shaped portion in the first direction gradually decreases.

13. The display apparatus of claim 10, wherein in a section parallel to the second direction, the pixel opening has a rectangular shape, the island-shaped portion has a rectangular shape, and the sidewalls of the pixel opening are respectively parallel to the sidewalls of the island-shaped portion.

14. The display apparatus of claim 13, wherein in the section parallel to the second direction, an edge of each of the sidewalls of the pixel opening is spaced from an edge of a corresponding one of the sidewalls of the island-shaped portion which is adjacent to the each of the sidewalls of the pixel opening by a uniform interval.

15. The display apparatus of claim 10, wherein in a section along the first direction, the island-shaped portion has a trapezoidal shape;

in the first direction, a height of the sidewall of the pixel opening is equal to a height of the sidewall of the island-shaped portion.

16. The display apparatus of claim 10, wherein:

in the direction from the first surface of the pixel defining layer to the second surface of the pixel defining layer, a width of the ring-shaped pixel groove gradually increases;

in the first direction, a section of the ring-shaped pixel groove has a shape of an inverted trapezoid.

17. The display apparatus of claim 10, wherein the light-emitting unit further comprises:

a first insulating layer, wherein the pixel defining layer and the island-shaped portion are disposed on the first insulating layer, a part of the first insulating layer is exposed between the sidewalls of the pixel opening and the sidewalls of the island-shaped portion and forms a bottom of the ring-shaped pixel groove;

wherein the first electrode layer further comprises: a ring-shaped portion covering the part of the first insulating layer exposed between the sidewalls of the pixel opening and the sidewalls of the island-shaped portion, and the second insulating layer exposes at least a part of the ring-shaped portion of the first electrode layer;

wherein a width of the ring-shaped portion of the first electrode layer or a width of the exposed part of the ring-shaped portion of the first electrode layer is less than or equal to 6 μm in a direction from the sidewall of the pixel opening to the sidewall of the island-shaped portion.

* * * * *